(12) United States Patent
Yamagata et al.

(10) Patent No.: US 12,414,255 B2
(45) Date of Patent: Sep. 9, 2025

(54) LEAD HOLDING PORTION STRUCTURE AND MOTOR

(71) Applicant: MABUCHI MOTOR CO., LTD., Chiba (JP)

(72) Inventors: Yasuhiro Yamagata, Chiba (JP); Akiko Saito, Chiba (JP)

(73) Assignee: MABUCHI MOTOR CO., LTD., Chiba (JP)

( * ) Notice: Subject to any disclaimer, the term of this patent is extended or adjusted under 35 U.S.C. 154(b) by 0 days.

(21) Appl. No.: 18/838,235

(22) PCT Filed: Dec. 26, 2023

(86) PCT No.: PCT/JP2023/046709
§ 371 (c)(1),
(2) Date: Aug. 14, 2024

(87) PCT Pub. No.: WO2025/141707
PCT Pub. Date: Jul. 3, 2025

(65) Prior Publication Data
US 2025/0212350 A1   Jun. 26, 2025

(51) Int. Cl.
*H05K 7/14* (2006.01)
*H02K 7/00* (2006.01)

(52) U.S. Cl.
CPC .............. *H05K 7/14* (2013.01); *H02K 7/00* (2013.01)

(58) Field of Classification Search
CPC ........................... H05K 5/0017; H05K 5/0217
(Continued)

(56) References Cited

U.S. PATENT DOCUMENTS

| 4,095,043 | A |   | 6/1978 | Martin et al. |
| 5,532,703 | A | * | 7/1996 | Stephens ................ H01Q 1/242 |
|           |   |   |        | 343/702 |

(Continued)

FOREIGN PATENT DOCUMENTS

| CN | 106385130 A |   | 2/2017 |          |
| DE | 102021126730 A1 | * | 4/2022 | ............... H02G 3/32 |

(Continued)

OTHER PUBLICATIONS

International Search Report in PCT Application No. PCT/JP2023/046709 mailed Mar. 26, 2024, 5pp.

(Continued)

*Primary Examiner* — Hung S. Bui
(74) *Attorney, Agent, or Firm* — HAUPTMAN HAM, LLP (57) ABSTRACT

A holding portion structure in which a lead is held between a first component and a second component to be assembled to the first component, and the lead is drawn out from inside the first component and the second component includes: two first recessed portions that are arranged side by side, spaced apart from each other along an extension direction of the lead, and each include a groove extending in the extension direction; and a second recessed portion that is located between the two first recessed portions in an assembled state of the first component and the second component, and includes a groove that is in opposite orientation to the grooves of the first recessed portions and extends in the extension direction. In the above assembled state, the lead placed in the grooves of the first recessed portions and in the groove of the second recessed portion is bent and held by the first recessed portions and the second recessed portion.

9 Claims, 5 Drawing Sheets

(58) Field of Classification Search
USPC .................................... 361/807, 809, 810
See application file for complete search history.

(56) References Cited

U.S. PATENT DOCUMENTS

| | | | |
|---|---|---|---|
| 9,007,774 B2 * | 4/2015 | Furubo | G06F 1/1626 |
| | | | 361/728 |
| 2013/0094161 A1 * | 4/2013 | Ochi | H01Q 1/52 |
| | | | 361/752 |
| 2015/0101837 A1 | 4/2015 | Evangelista et al. | |

FOREIGN PATENT DOCUMENTS

| | | | | |
|---|---|---|---|---|
| EP | 0644639 A1 | * | 9/1994 | ............ H02G 1/14 |
| JP | 2010273517 A | * | 12/2010 | ............ H02K 3/50 |
| JP | 5967349 B2 | | 8/2016 | |

OTHER PUBLICATIONS

Written Opinion in PCT Application No. PCT/JP2023/046709 mailed Mar. 26, 2024, 6pp.
Office Action in DE Application No. 11 2023 000 463.3 dated Apr. 23, 2025, 11pp.

* cited by examiner

LEAD HOLDING PORTION STRUCTURE AND MOTOR

RELATED APPLICATIONS

The present application is a National Phase of International Application No. PCT/JP2023/046709 filed Dec. 26, 2023.

TECHNICAL FIELD

The present invention relates to a holding portion structure for holding a lead and a motor to which the holding portion structure is applied.

BACKGROUND ART

Structures for holding the leads drawn from the inside to the outside of a device in electronic devices using leads have been proposed. For example, Patent Literature 1 discloses an electric motor having a configuration in which leads connected to a circuit board are drawn to the outside via a bushing. The bushing of Patent Literature 1 includes a pair of holding pieces that hold the leads sandwiched from both sides, and one of the holding pieces is provided with holding grooves each holding one lead. Moreover, the other holding piece is provided with engagement protruding portions that firmly hold the leads by pressing parts of the peripheries of the leads housed in the holding grooves.

CITATION LIST

Patent Literature

Patent Literature 1: Japanese Patent No. 5967349

DISCLOSURE OF THE INVENTION

Problems to be Solved by the Invention

However, in the configuration of Patent Literature 1 above, the leads that are held in the holding grooves of the bushing and drawn to the outside extend substantially in a straight line from end portions, which are connected to the circuit board, of the leads, and when a tensile force is applied in a longitudinal direction (extension direction) of the leads, the tensile force acts on the end portions connected to the circuit board. Hence, the connected end portions may be detached from the circuit board depending on the magnitude of the tensile force, which may cause breaks in the leads. Hence, there is room for improvement in the structure of a portion where the leads are drawn to the outside of the device. Note that this problem is not limited to electric motors (motors), such as in Patent Literature 1, but can occur similarly in electronic devices using leads.

A lead holding portion structure and motor of the present invention have been devised in view of such a problem, and one of objects thereof is to prevent a break in a lead. Note that objects of the present invention are not limited to this object, but also include another object of exerting operations and effects that can be derived from configurations presented in DESCRIPTION OF PREFERRED EMBODIMENT described below, the operations and effects being unobtainable by the known technology.

SOLUTIONS TO THE PROBLEMS

A lead holding portion structure and motor of the disclosure can be realized as aspects (application examples) disclosed below, and solve at least a part of the above problem. Any of Aspects 2 to 6 and Aspects 8 to 9 is an aspect that can be additionally selected as appropriate, and is an aspect that can be omitted. Any of Aspects 2 to 6 and Aspects 8 to 9 does not disclose an aspect and configuration that are essential to the present invention.

Aspect 1. A lead holding portion structure of the disclosure is a holding portion structure in which a lead is held between a first component and a second component to be assembled to the first component, and the lead is drawn out from inside the first component and the second component, the lead holding portion structure including: two first recessed portions that are arranged side by side, spaced apart from each other along an extension direction of the lead, and each include a groove extending in the extension direction; and a second recessed portion that is located between the two first recessed portions in an assembled state of the first component and the second component, and includes a groove that is in opposite orientation to the grooves of the first recessed portions and extends in the extension direction, in which in the assembled state, the lead placed in the grooves of the first recessed portions and in the groove of the second recessed portion is bent and held by the first recessed portions and the second recessed portion.

Aspect 2. In the above Aspect 1, it is preferable that in the assembled state, the lead be held by one or both of two opposing corner portions of one of the first recessed portions and the second recessed portion and two opposing corner portions of the other first recessed portion and the second recessed portion.

Aspect 3. In the above Aspect 1 or 2, it is preferable that either the first recessed portions or the second recessed portion be provided to the first component, and the other be provided to the second component, and a recessed portion or portions provided to a component where the lead is placed, the component being either the first component or the second component, be less in a groove width than a recessed portion or portions provided to a component where the lead is not placed, the component being the other.

Aspect 4. In any of the above Aspects 1 to 3, it is preferable that at least one of the first recessed portions and the second recessed portion have a projection portion protruding from an inner surface of the groove.

Aspect 5. In the above Aspect 4, it is preferable that the projection portion be provided on one or each of two opposing side surfaces of the inner surface of the groove.

Aspect 6. In the above Aspect 4 or 5, it is preferable that the projection portion have a shape tapered from a proximal end toward a distal end.

Aspect 7. A motor of the disclosure is a motor to which the lead holding portion structure according to any one of the above Aspects 1 to 6 is applied, in which the first component is a housing in which a connection target of the lead is placed, and the second component is an end bell to be assembled to an opening of the housing.

Aspect 8. In the above Aspect 7, it is preferable that the first recessed portions and/or the second recessed portion be provided integrally with the housing and/or the end bell.

Aspect 9. In the above aspect 7, it is preferable that the first recessed portions and/or the second recessed portion be provided to components different from the housing and the end bell, and the different components be installed on the housing and the end bell, respectively.

Effects of the Invention

According to the lead holding portion structure and motor of the disclosure, the lead is bent and held by the first recessed portions and the second recessed portion. Therefore, a break in the lead can be prevented even if a tensile force is applied in an extension direction (longitudinal direction) of the lead.

BRIEF DESCRIPTION OF THE DRAWINGS

FIGS. 3A and 3B are diagrams illustrating a motor to which the lead holding portion structure according to the embodiment is applied.

FIGS. 4A and 4B are diagrams illustrating main elements of a housing of the motor of FIGS. 3A and 3B.

FIGS. 5A and 5B are diagrams illustrating main elements of an end bell of the motor of FIGS. 3A and 3B.

DESCRIPTION OF PREFERRED EMBODIMENTS

A lead holding portion structure and a motor as an embodiment are described with reference to the drawings. The embodiment presented below is a mere exemplification. There is no intention to preclude various modifications and application of a technology, which are not explicitly stated in the embodiment below. The configurations of the embodiment can be modified and carried out in various manners within the scope that does not depart from the purport of the configurations. Moreover, a selection can be made from the configurations as needed, or the configurations can be combined as appropriate.

1. Lead Holding Portion Structure

Figure 1:
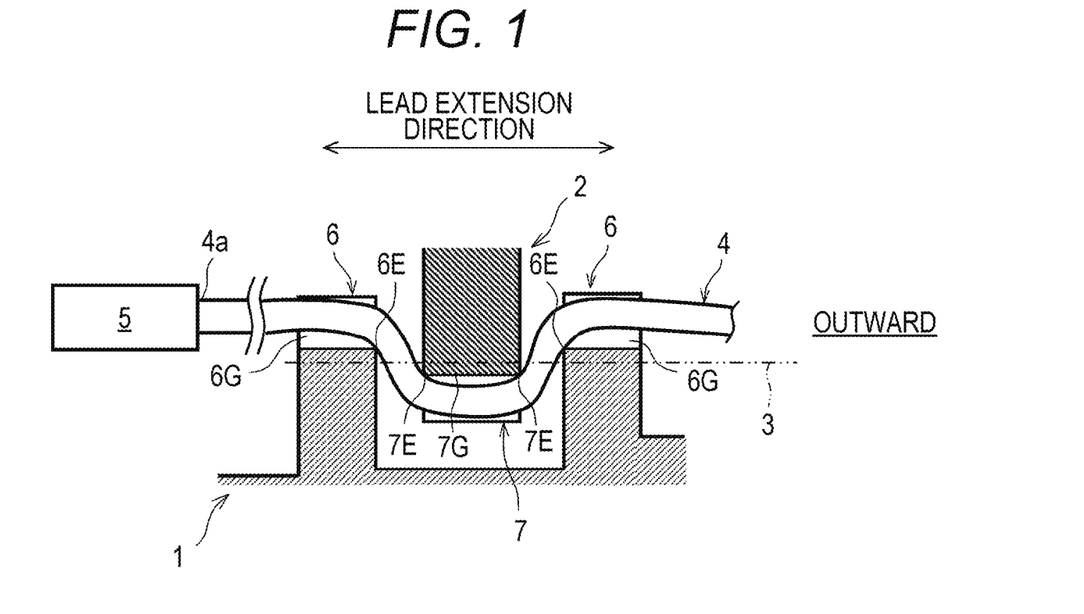
FIG. 1 is a cross-sectional view for explaining a lead holding portion structure according to an embodiment, taken along a longitudinal direction of a lead.
Figure 2:
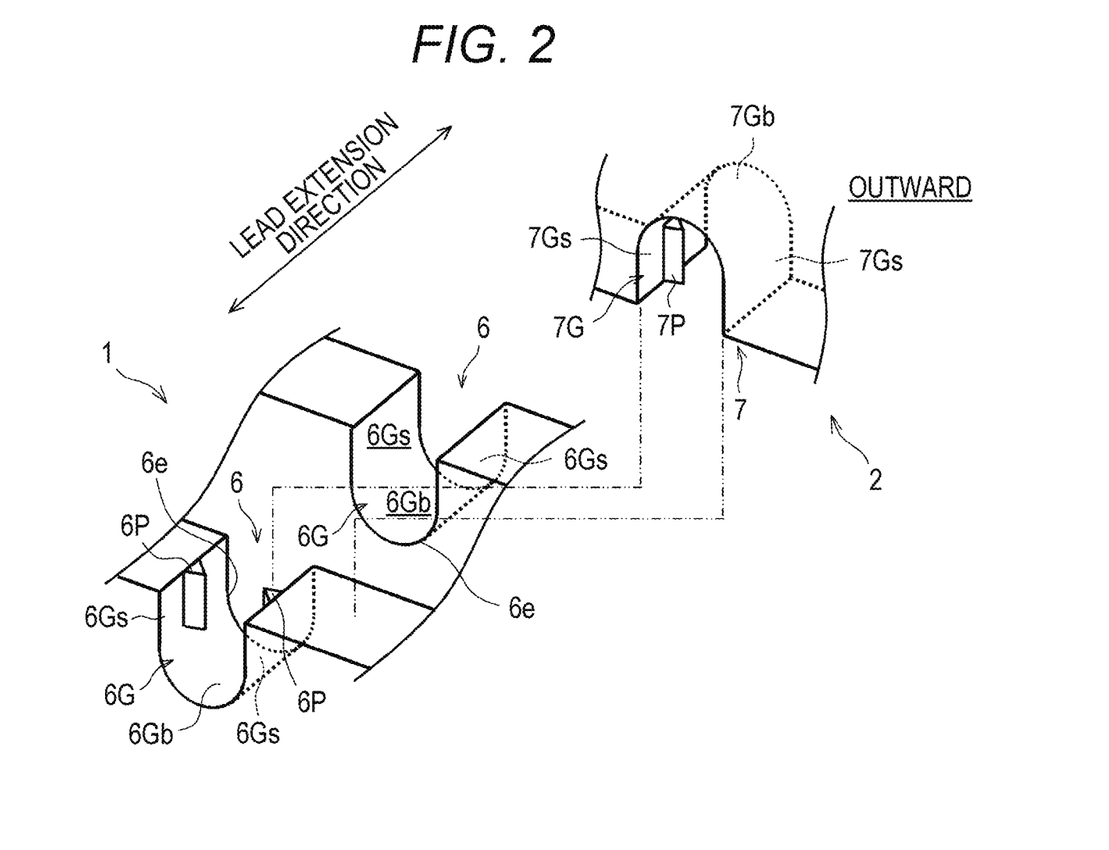
FIG. 2 is an exploded perspective view for explaining the lead holding portion structure according to the embodiment, in which the lead is omitted.

FIGS. 1 and 2 are diagrams for explaining a lead holding portion structure (hereinafter referred to as the "holding portion structure"). As illustrated in FIG. 1, the holding portion structure is a structure in which a lead 4 is held between a first component 1 and a second component 2 that is assembled to the first component 1, and the lead 4 is drawn out from inside the first component 1 and the second component 2. An end portion 4a of the lead 4 is connected to, for example, a component that is placed inside the first component 1 and the second component 2 (hereinafter referred to as a "connection target 5"). The number of the leads 4 is not particularly limited. When one lead 4 is connected to the connection target 5, one holding portion structure is provided. Moreover, when a plurality of the leads 4 is connected to the connection target 5, the same number of the holding portion structures as the number of the leads 4 is provided. In other words, the holding portion structure is provided to each lead 4.

The connection target 5 is a component to which the end portion 4a of the lead 4 is connected, and examples thereof include a coil and a circuit board. The first component 1 of the embodiment is a component where the connection target 5 is placed (or housed or installed). On the other hand, the second component 2 is a component that is assembled to (or mounted on, engaged with, or installed on) the first component 1, and is a component different from the first component 1. Note that the connection target 5 may be placed in or on the second component 2. In a state where the first component 1 and the second component 2 are assembled together (hereinafter referred to as the "assembled state"), mating surfaces 3 are formed by two surfaces of the two components 1 and 2 (a surface of the first component 1 and a surface of the second component 2), which face or touch each other. In FIG. 1, the mating surfaces 3 are schematically illustrated by a chain double-dashed line. Note that the mating surfaces 3 are not limited to flat surfaces but may be curved surfaces, and are not limited to being flush but may be stepped surfaces or inclined surfaces. The holding portion structure is provided to, for example, a part of the mating surfaces 3. In this case, this part is provided with a gap through which at least the lead 4 can be inserted.

As illustrated in FIGS. 1 and 2, the holding portion structure includes two first recessed portions 6 arranged side by side, spaced apart from each other along an extension direction of the lead 4, and one second recessed portion 7 placed between the two first recessed portions 6 in the assembled state of the first component 1 and the second component 2. The term "extension direction" used here is a direction in which the lead 4 extends with the lead 4 drawn out from the end portion 4a, at a position where the holding portion structure is provided (a longitudinal direction of the lead 4 at the position of the holding portion structure). The second recessed portion 7 is placed between the two first recessed portions 6. Therefore, the distance of separation between the two first recessed portions 6 is set to be greater than the dimension of the second recessed portion 7 in the extension direction.

The two first recessed portions 6 are each formed by cutting a notch in a part of a predetermined component (the first component 1, the second component 2, or a component different from them), and each include a groove 6G that extends in the extension direction and is open in the extension direction. The two first recessed portions 6 are formed in such a manner that the grooves 6G are located substantially on a straight line. The lead 4 is placed in the grooves 6G. As illustrated in FIG. 2, each of the grooves 6G is formed by two side surfaces 6Gs facing each other, and a bottom surface 6Gb. The each of the grooves 6G illustrated in FIG. 2 has a shape that joins the two flat side surfaces 6Gs at their lower end in the drawing to the curved bottom surface 6Gb protruding downward. Note that the shape of the grooves 6G is not limited to the above.

The second recessed portion 7 is formed by cutting a notch in a part of a predetermined component (the first component 1, the second component 2, or a component different from them) different from the component where the first recessed portions 6 are provided, and includes a groove 7G that extends in the extension direction and is open in the extension direction. The lead 4 is placed also in the groove 7G. The groove 7G is formed by two side surfaces 7Gs facing each other and a bottom surface 7Gb. The groove 7G illustrated in FIG. 2 has a shape that joins the two flat side surfaces 7Gs at their upper end in the drawing to the curved bottom surface 7Gb protruding upward. However, the shape of the groove 7G is not limited to the above.

In the holding portion structure, these two types of the grooves 6G and 7G are provided in opposite orientation to each other. Hence, as illustrated in FIG. 1, in the assembled state, the lead 4 placed in the grooves 6G and the groove 7G is bent and held by the first recessed portions 6 and the second recessed portion 7. In other words, the lead 4 is held in a state of being bent in a U shape as viewed in a direction orthogonal to both the extension direction of the lead 4 and depth directions of the grooves 6G and 7G. Consequently, even if a tensile force from the outside is applied to the lead 4, a break in the lead 4 (for example, disconnection from or a break at the end portion 4a) is prevented. Note that the term "opposite orientation" used here means that the depth directions of the grooves 6G and 7G toward the bottom surfaces 6Gb and 7Gb are different (inverted) by 180 degrees.

In FIGS. 1 and 2, the two first recessed portions 6 are provided to the first component 1, and the second recessed portion 7 is provided to the second component 2. Hence, when the first component 1 and the second component 2 are brought into the assembled state with the lead 4 placed in the grooves 6G of the two first recessed portions 6, the lead 4 is positioned in the groove 7G of the second recessed portion 7 and pressed against the bottom surface 7Gb of the groove 7G. In other words, the lead 4 is sandwiched between the grooves 6G and 7G of two recessed portions 6 and 7 in two directions displaced 180 degrees, and is bent and held in a U shape as illustrated in FIG. 1.

Note that the second recessed portion 7 may be provided to the first component 1, and the two first recessed portions 6 may be provided to the second component 2. Even in this case, similarly to the above, the lead 4 is sandwiched between the grooves 6G and 7G of two recessed portions 6 and 7 in the two directions displaced 180 degrees, and therefore, is bent and held in a U shape. Moreover, the first recessed portions 6 may not be formed directly on the first component 1 or the second component 2 and, for example, the first recessed portions 6 may be provided in advance to a component (not illustrated) different from these components 1 and 2, and this component may be installed on the first component 1 or the second component 2. The same applies to the second recessed portion 7. In other words, the second recessed portion 7 may not be formed directly on the first component 1 or the second component 2 and, for example, the second recessed portion 7 may be provided in advance to a component (not illustrated) different from the components 1 and 2 and a component provided with the first recessed portions 6, and this component may be installed on the first component 1 or the second component 2 (a component that is not provided with the first recessed portions 6).

In the holding portion structure, it is preferable that the lead 4 be held by corner portions 6E and 7E of the recessed portions 6 and 7 in the assembled state. Specifically, it is preferable that the lead 4 be held by two opposing corner portions 6E and 7E of one of the first recessed portions 6 (for example, the left first recessed portion 6 in FIG. 1) and the second recessed portion 7 and two opposing corner portions 6E and 7E of the other first recessed portion 6 (the right first recessed portion 6 in FIG. 1) and the second recessed portion 7. Note that the term "corner portion" is an edge portion, which is open in the extension direction, of each of the grooves 6G and 7G. Moreover, it is more preferable that each of the corner portions 6E and 7E dig into the lead 4. The lead 4 is held more firmly by the corner portions 6E and 7E. Note that the corner portions 6E and 7E may have what is called a chamfered shape.

In the holding portion structure, either the first recessed portions 6 or the second recessed portion 7 is provided to the first component 1, and the other of the first recessed portions 6 or the second recessed portion 7 is provided to the second component 2. However, it is preferable that the recessed portions 6 or the recessed portion 7 provided to a component where the lead 4 is placed (here, the first component 1) be less in a groove width than the recessed portion 7 or the recessed portions 6 provided to a component where the lead 4 is not placed (here, the second component 2). The term "groove width" used here is the distance of separation between two side surfaces forming a groove. In FIGS. 1 and 2, the first recessed portions 6 are provided to the first component 1 where the lead 4 is placed, and the second recessed portion 7 is provided to the second component 2. Therefore, it is preferable that the first recessed portions 6 be less in the groove width than the second recessed portion 7. Note that in a case of an opposite configuration, it is preferable that the magnitude relationship of the groove width be also opposite.

When the lead 4 is connected to the connection target 5 placed in the first component 1, the second component 2 is assembled to the first component 1 with the lead 4 placed in a groove or grooves of a recessed portion or portions (for example, the first recessed portions 6) of the first component 1. Hence, for example, when the first recessed portions 6 are less in the groove width than a recessed portion (in this case, the second recessed portion 7) of the second component 2, the lead 4 easily enters the groove 7G of the second recessed portion 7 when the lead 4 is bent, and the assemblability improves. Note that when the groove width of the recessed portion or portions (for example, the first recessed portions 6) of the first component 1 is equal to or slightly greater than the outer diameter of the lead 4, the lead 4 can be positioned by the recessed portions, and the assemblability improves further.

Moreover, as illustrated in FIG. 2, it is preferable in the holding portion structure that at least one of the first recessed portions 6 and the second recessed portion 7 have a projection portion 6P or 7P that protrudes from an inner surface of the groove 6G or 7G. The projection portions 6P and 7P have a function (a function similar to the corner portions 6E and 7E) of holding the lead 4 more firmly by digging into the lead 4 placed in the grooves 6G and 7G. In the example illustrated in FIG. 2, one of the two first recessed portions 6, which is closer to the connection target 5, is provided with the projection portion 6P, and the second recessed portion 7 is also provided with the projection portion 7P. Put another way, the other first recessed portion 6, which is farther from the connection target 5 (is further out), does not have the projection portion 6P. Consequently, when the first component 1 and the second component 2 are assembled together (when the lead 4 is bent), the lead 4 located in the other first recessed portion 6 without the projection portion 6P can slide in the groove 6G. Therefore, the bending deformation of the lead 4 is not hindered.

It is preferable that the projection portion 6P be provided on a part of the inner surface of the groove 6G in the extension direction (a central portion in the extension direction in FIG. 2), and furthermore, it is preferable that the projection portion 6P be provided on one or each of the two opposing side surfaces 6Gs on the inner surface (put another way, not provided on the bottom surface 6Gb). Consequently, when the first component 1 and the second component 2 are assembled together (when the lead 4 is bent), the lead 4 is not pushed up off the bottom surface 6Gb. Therefore, the second component 2 does not lift relative to the first component 1, and excellent assemblability is secured. Moreover, it is preferable that the projection portion 6P have a shape tapered from a proximal end (an end portion in contact with the inner surface) toward a distal end. Consequently, the distal end easily digs into the lead 4, and the holding force increases.

The same applies to the projection portion 7P. In other words, it is preferable that the projection portion 7P be provided on a part of the inner surface of the groove 7G in the extension direction (a central portion in the extension direction in FIG. 2), and furthermore, it is preferable that the projection portion 7P be provided on one or each of the two opposing side surfaces 7Gs on the inner surface (not provided on the bottom surface 7Gb). Moreover, it is preferable that the projection portion 7P also have a shape tapered from a proximal end (an end portion in contact with the inner surface) toward a distal end. Note that each of the two first recessed portions 6 may be provided with the projection portion 6P, or only one of the first recessed portion 6 or the second recessed portion 7 may be provided with the projection portion 6P or 7B.

2. Motor

Figure 3A:
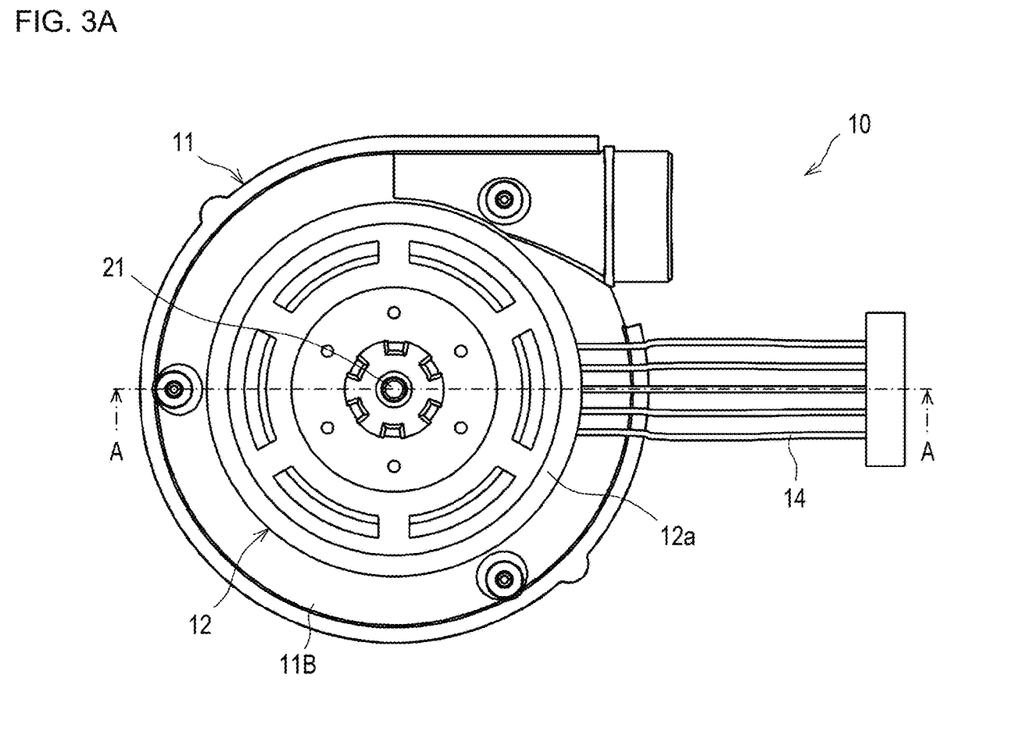
FIG. 3A is a plan view.
Figure 3B:
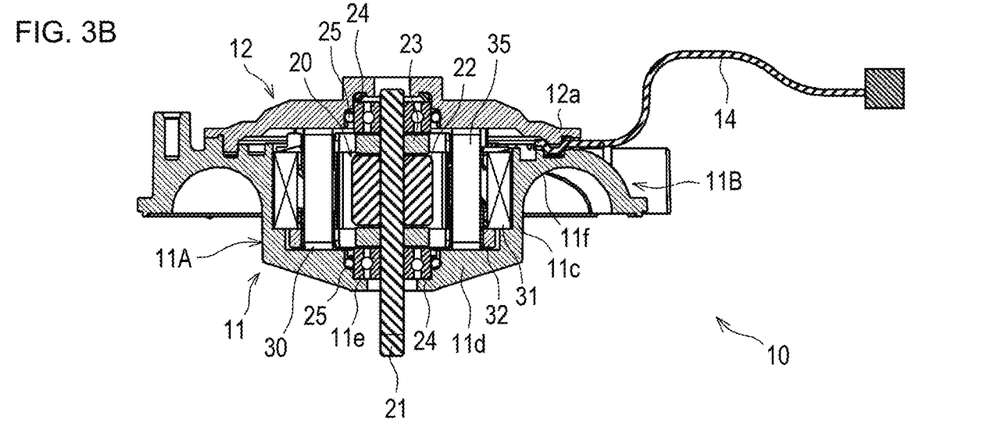
FIG. 3B is a cross-sectional view on arrows A-A of FIG. 3A.

Next, a motor 10 to which the above holding portion structure is applied is described as an example of the holding portion structure. FIG. 3A is a plan view of the motor 10, and FIG. 3B is an axial cross-sectional view [a cross-sectional view on arrows A-A of FIG. 3A] of the motor 10 through the holding portion structure. As illustrated in FIG. 3B, the motor 10 is an inner rotor brushless motor, and is configured in such a manner that a rotor 20 that rotates integrally with a shaft 21 and a stator 30 located further out radially (hereinafter simply referred to as the "outer side") than the rotor 20 are incorporated in a housing 11. The motor 10 of the example functions as a driving source of a blower with an impeller (not illustrated) fixed to the shaft 21.

The rotor 20 includes a magnet 22 fixed to the shaft 21 and two balancers 23 sandwiching the magnet 22 in the axial direction, and is rotatably fixed with bearings 24 to the housing 11 and an end bell 12. The stator 30 includes a stator core 31 fixed to an inner peripheral surface of the housing 11, and a coil 35 wound around the stator core 31 via an insulator 32. The coil 35 is connected at its end portion to a lead 14.

The housing 11 includes a bottomed cylindrical portion 11A that forms a space in which the rotor 20 and the stator 30 are placed, and an annular portion 11B that forms an impeller placement space between the annular portion 11B and an unillustrated cover member. The annular portion 11B is formed continuously toward the outer side from an outer peripheral surface of a side wall portion 11c of the bottomed cylindrical portion 11A. An upper end portion of the annular portion 11B functions as a flange portion 11f extending from the side wall portion 11c toward the outer side.

A bottom portion 11d of the bottomed cylindrical portion 11A is provided with a through-hole through which the shaft 21 is inserted, and a stepped portion 11e to which the bearing 24 and an O-ring 25 are fixed. An opening of the bottomed cylindrical portion 11A (an opening formed by an upper edge of the side wall portion 11c) is covered with the end bell 12. The end bell 12 is a lid member that is assembled to the housing 11. In the example, an outer peripheral end portion 12a of the end bell 12 is mounted on the flange portion 11f of the housing 11, and the end bell 12 is fixed to the housing 11.

In other words, in the example, the housing 11 corresponds to the above first component 1. The end bell 12 that is assembled to the opening of the housing 11 corresponds to the second component 2. The lead 14 is held between the housing 11 and the end bell 12 and drawn out from inside the housing 11 and the end bell 12. Moreover, the coil 35 to which an end portion of the lead 14 is connected corresponds to the above connection target 5, and surfaces, which face each other, of the flange portion 11f and the outer peripheral end portion 12a correspond to the above mating surfaces 3. As illustrated in FIG. 3A, the holding portion structure of the example is provided to a part of the opposing surfaces in a circumferential direction (a portion from which the lead 14 is drawn out). Note that in the example, five leads 14 are arranged side by side. Therefore, five holding portion structures are arranged side by side. All the five holding portion structures are configured similarly. Therefore, unless otherwise mentioned in the following description, reference signs are assigned to one holding portion structure, of which a description is given.

Figure 4A:
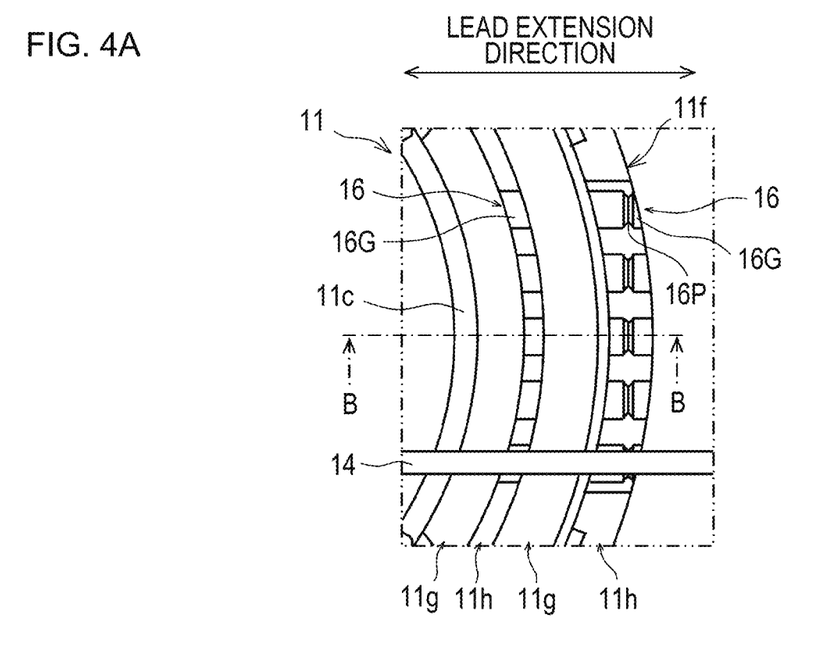
FIG. 4A is a plan view.
Figure 4B:
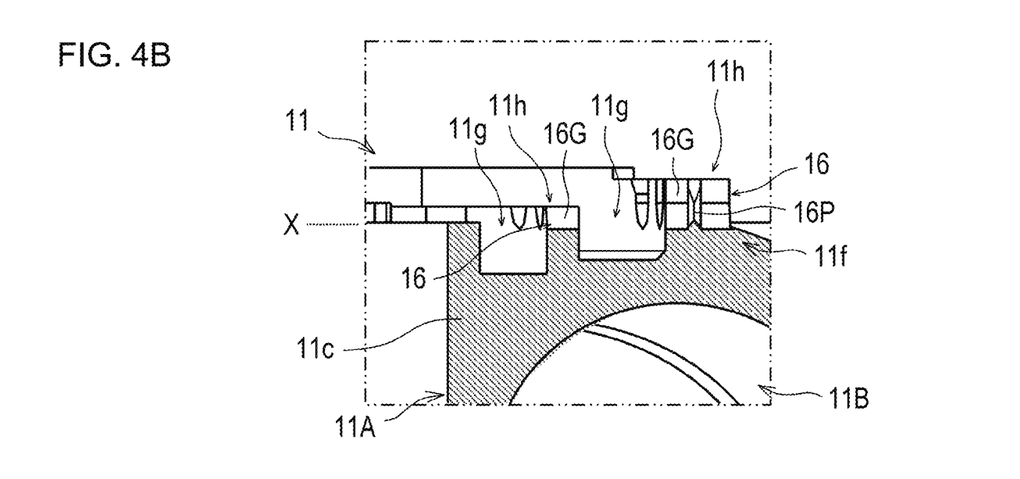
FIG. 4B is a cross-sectional view on arrows B-B of FIG. 4A.
Figure 5A:
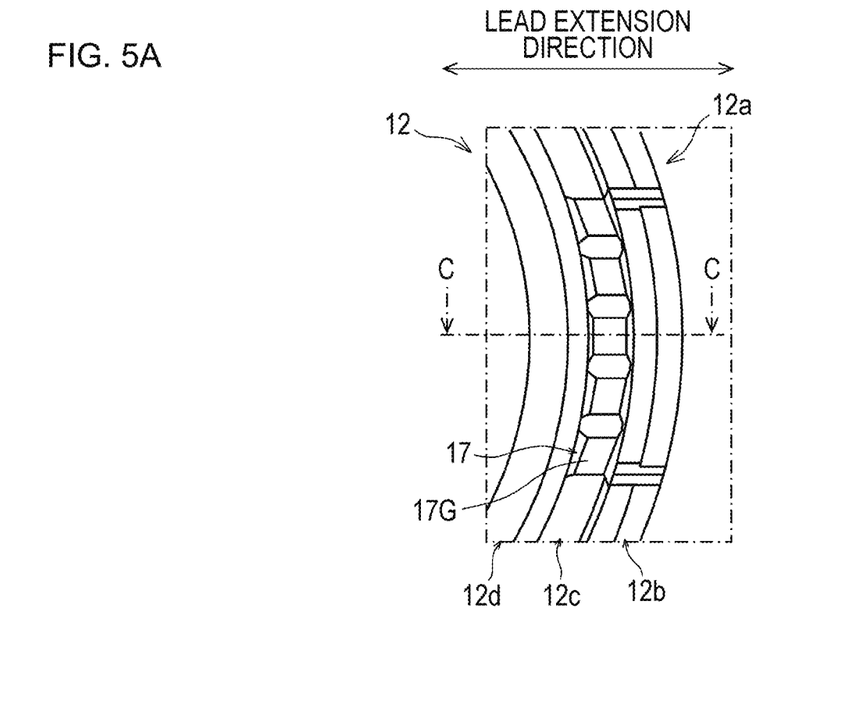
FIG. 5A is a plan view.
Figure 5B:
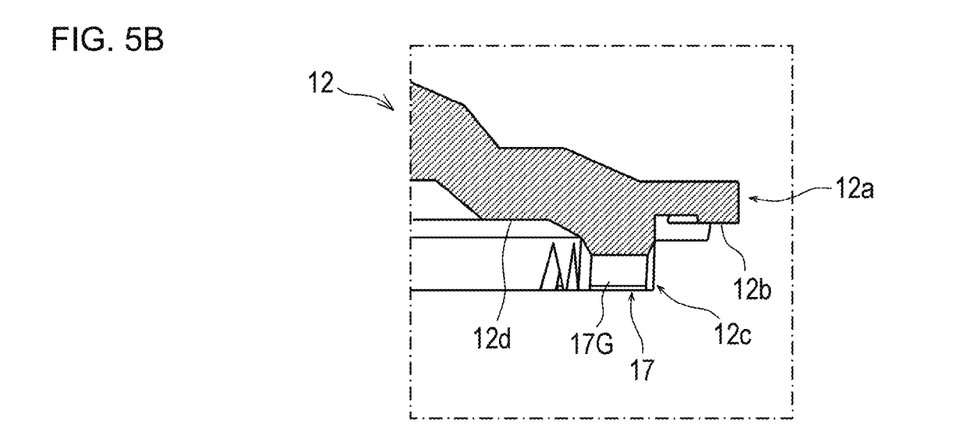
FIG. 5B is a cross-sectional view on arrows C-C of FIG. 5A.
Figure 6:
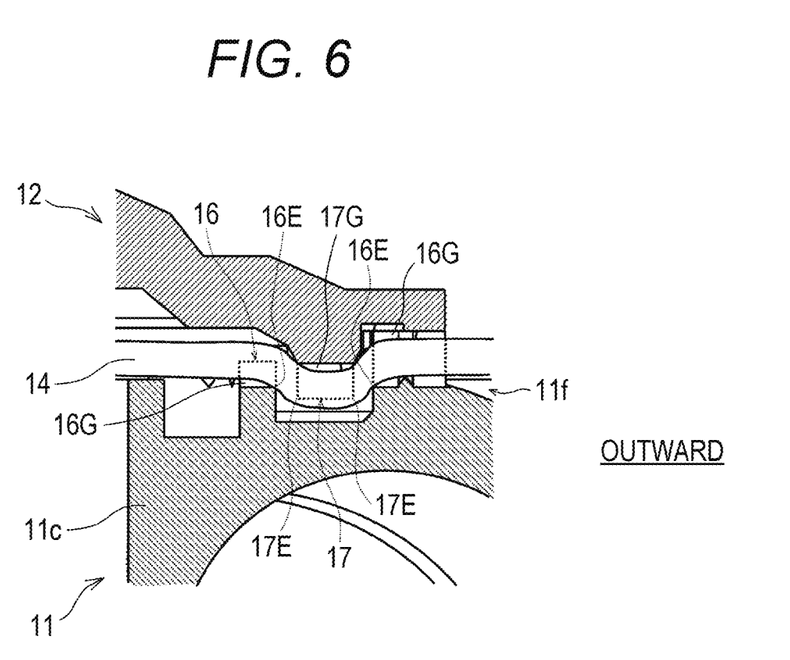
FIG. 6 is a cross-sectional view illustrating a state in which the lead is held by the lead holding portion structure applied to the motor of FIGS. 3A and 3B.

Next, the holding portion structure of the example is described, using FIGS. 4A and 4B, FIGS. 5A and 5B, and FIG. 6. FIGS. 4A and 4B are a plan view and a cross-sectional view [a cross-sectional view on arrows B-B of FIG. 4A], which illustrate main elements of the housing 11, and FIGS. 5A and 5B are a plan view and a cross-sectional view [a cross-sectional view on arrows C-C of FIG. 5A], which illustrate main elements of the end bell 12. FIG. 6 is a cross-sectional view illustrating a state in which the lead 14 is held by the holding portion structure. Note that only one lead wire 14 is illustrated only in FIG. 4A.

As illustrated in FIG. 4B, in terms of the flange portion 11f of the housing 11, an end surface on the end bell 12 side (an upper surface in the drawing) is not a flat surface but an uneven surface in the axial direction. Hereinafter, the surface on the end bell 12 side (the surface facing the end bell 12) is referred to as the "upper end surface" for convenience. Specifically, let the axial position of the upper end surface of the side wall portion 11c be a reference position X. Two annular protruding portions 11h protruding toward the end bell 12 relative to the reference position X and two annular recessed portions 11g recessed in a direction away from the end bell 12 relative to the reference position X are provided. The annular protruding portions 11h and the annular recessed portions 11g have concentric annular shapes centered on the axis of the shaft 21 as viewed in the axial direction, and are alternately provided in the order of the annular recessed portion 11g, the annular protruding portion 11h, the annular recessed portion 11g, and the annular protruding portion 11h from the radially inner side (hereinafter simply referred to as the "inner side").

In the example, a first recessed portion 16 corresponding to the above first recessed portion 6 is formed in each of the two annular protruding portions 11h. In other words, two first recessed portions 16 are provided integrally with the housing 11. In the example, as illustrated in FIG. 4A, one of the first recessed portions 16 is formed by cutting a notch in the upper end surface of the annular protruding portion 11h on the inner side, and the other first recessed portion 16 is formed by cutting a notch in the upper end surface of the annular protruding portion 11h on the outer side. Each of the first recessed portions 16 includes a groove 16G extending in the extension direction of the lead 14.

Note that in the example, as illustrated in FIG. 4B, the annular protruding portion 11h on the outer side is greater in the amount of protrusion from the reference position X than the annular protruding portion 11h on the inner side. However, bottom surface positions (axial positions of bottom surfaces) of the grooves 16G of the two first recessed portions 16 are substantially level with each other. In other words, the groove 16G of the first recessed portion 16 on the outer side is formed deeper. Note that the groove widths of the two first recessed portions 16 are substantially equal to each other. Moreover, as illustrated in FIG. 4A, a projection portion 16P corresponding to the above projection portion 6P is provided to the first recessed portion 16 on the outer side.

As illustrated in FIG. 5B, also in terms of the outer peripheral end portion 12a of the end bell 12, an end surface on the housing 11 side (a lower surface in the drawing) is not a flat surface but an uneven surface in the axial direction. Hereinafter, the surface on the housing 11 side (the surface facing the housing 11) is referred to as the "lower end surface" for convenience. The lower end surface of the outer peripheral end portion 12a has an uneven shape matching the shape of the upper end surface of the flange portion 11f. Specifically, a mounting surface 12b that is mounted on (placed in contact with) the annular protruding portion 11h on the outer side of the flange portion 11f, an annular protruding portion 12c that fits in the annular recessed portion 11g on the outer side, and an opposing surface 12d facing the annular protruding portion 11h on the inner side are provided.

The annular protruding portion 12c protrudes toward the housing 11 from the mounting surface 12b. The radial dimension of the annular protruding portion 12c is set to a size that, in a state where the mounting surface 12b is mounted on the annular protruding portion 11h (that is, in the above assembled state), does not allow the annular protruding portion 12c to contact the annular recessed portion 11g and forms a gap equal to or slightly smaller than the outer diameter of the lead 14 between the annular protruding portion 12c and each of the two annular protruding portions 11h. The amount of protrusion of the annular protruding portion 12c from the mounting surface 12b is set to, for example, a size that does not allow the annular protruding portion 12c to contact the annular recessed portion 11g in the assembled state. All of the mounting surface 12b, the annular protruding portion 12c, and the opposing surface 12d have concentric annular shapes centered on the axis of the shaft 21 as viewed in the axial direction, and are provided in this order from the outer side.

In the example, a second recessed portion 17 corresponding to the above second recessed portion 7 is formed in the annular protruding portion 12c. In other words, the second recessed portion 17 is provided integrally with the end bell 12. In the example, as illustrated in FIG. 5A, the second recessed portion 17 is formed by cutting a notch in an upper end surface of the annular protruding portion 12c. The second recessed portion 17 includes a groove 17G extending in the extension direction of the lead 14. The depth of the groove 17G is set according to, for example, the outer diameter of the lead 14, the size of the annular protruding portion 12c in relation to the annular recessed portion 11g, and the depth of the grooves 16G of the first recessed portions 16. Moreover, the groove width of the groove 17G is set to be slightly less than the groove width of the grooves 16G.

As illustrated in FIG. 6, in the assembled state where the end bell 12 is assembled to the housing 11, the lead 14 placed in the grooves 16G of the first recessed portions 16 and the groove 17G of the second recessed portion 17 is bent and held by the first recessed portions 16 and the second recessed portion 17. Furthermore, the lead 14 is held by two opposing corner portions 16E and 17E of one of the first recessed portions 16 and the second recessed portion 17 and two opposing corner portions 16E and 17E of the other first recessed portion 16 and the second recessed portion 17.

3. Effects (1) As illustrated in FIG. 1, in the above-mentioned holding portion structure, the lead 4 is held between the first component 1 and the second component 2, and the lead 4 is drawn out from inside the first component 1 and the second component 2. At this point in time, the lead 4 is bent and held by the two first recessed portions 6 and the one second recessed portion 7. Therefore, a break in the lead 4 can be prevented even if a tensile force is applied in the longitudinal direction (extension direction) of the lead 4. For example, when the lead 4 is connected to the connection target 5 placed inside the first component 1 and the second component 2, a tensile force is less likely to act on the connection area. Therefore, a break in the lead 4 can be prevented.

(2) In the above-mentioned holding portion structure, in the assembled state of the first component 1 and the second component 2, the lead 4 may be held by the two opposing corner portions 6E and 7E of the one of the first recessed portions 6 and the second recessed portion 7 and the two opposing corner portions 6E and 7E of the other first recessed portion 6 and the second recessed portion 7. In this case, the lead 4 can be firmly held by the four corner portions 6E and 7E. Consequently, even if a tensile force is applied in the longitudinal direction of the lead 4, a break in the lead 4 can be prevented.

(3) In the above-mentioned holding portion structure, a recessed portion or portions (the first recessed portions 6 or the second recessed portion 7) provided to a component where the lead 4 is placed (the first component 1) may be less in the groove width than a recessed portion or portions (the second recessed portion 7 or the first recessed portions 6) provided to a component where the lead 4 is not placed (the second component 2). In this case, when the lead 4 placed in the recessed portion or portions of the first component 1, which is the component where the lead 4 is placed, is bent by the recessed portion or portions of the second component 2, the lead 4 easily enters a groove or grooves of the recessed portion or portions of the second component 2. Therefore, the assemblability can be improved. In particular, when, for example, the dimensional tolerance of the groove width of the recessed portion or portions provided to the first component 1, and the dimensional tolerance of the wire diameter of the lead 4 are added, and the groove width of the recessed portion or portions provided to the second component 2 is provided wider than an area in which the lead 4 can be finally placed in the first component 1, for example, the dimensional tolerance of each component can be absorbed simply by assembling the second component 2 to the first component 1. Therefore, the assembly is facilitated.

(4) In the above-mentioned holding portion structure, at least one of the first recessed portions 6 and the second recessed portion 7 may have the projection portion 6P or 7P protruding from the inner surface of the groove 6G or 7G. In this case, the lead 4 can be firmly held by the projection portion 6P or 7P. Consequently, even if a tensile force is applied in the longitudinal direction of the lead 4, the tensile force can be prevented from acting on the connection area between the lead 4 and the connection target 5, and a break can be prevented. It is also possible to provide only one of the first recessed portion 6 or the second recessed portion 7 with the projection portion 6P or 7P. In this case, the projection portion 6P and the projection portion 7P dig less into the lead 4 upon assembly, as compared to the case where the projection portion 6P and the projection portion 7P are provided to both the first recessed portion 6 and the second recessed portion 7. Therefore, the repulsion of the lead 4 caused by digging is prevented, and each component can be easily assembled at its predetermined position.

(5) The above mentioned projection portions 6P and 7P may be provided on one or each of the two opposing side surfaces 6Gs of the inner surface of the groove 6G and on one or each of the two opposing side surfaces 7Gs of the inner surface of the groove 7G. In this case, the lead 4 is prevented from lifting by the projection portions 6P and 7P, and can be firmly held.

(6) Moreover, the projection portions 6P and 7P may have a shape tapered from the proximal end toward the distal end. In this case, since the distal ends of the projection portions 6P and 7P easily dig into the lead 4, the lead 4 can be held more firmly.

(7) The above-mentioned holding portion structure is applied to the above-mentioned motor 10. Specifically, the coil 35, which is the connection target of the lead 14, is placed in the housing 11 as the first component 1. The end bell 12 as the second component 2 is assembled to the housing 11. The above-mentioned holding portion structure is applied, when the lead 14 is held between the housing 11 and the end bell 12. Consequently, the above effects (1) to (6) can be obtained. Therefore, it is possible to prevent a break inside the motor 10 while securing pullout strength of the lead 14 that is drawn out from inside the housing 11 and the end bell 12.

(8) Furthermore, in the above-mentioned motor 10, the first recessed portions 16 are provided integrally with the housing 11, and the second recessed portion 17 is provided integrally with the end bell 12. Therefore, the assemblability can be improved without increasing the number of components. Note that it is also possible to adopt only one of the structure in which the first recessed portions 16 are provided integrally with the housing and the structure in which the second recessed portion 17 is provided integrally with the end bell.

4. Others

The above-mentioned motor 10 is an example, and the configuration thereof is not limited to the above-mentioned configuration. For example, both the first recessed portions 16 and the second recessed portion 17 may be provided to components different from both the housing 11 and the end bell 12. In this case, a portion (for example, a recess or an opening) where the different component is mounted is provided in advance to each of the housing 11 and the end bell 12, and the different components are mounted on the housing 11 and the end bell 12, respectively. Therefore, operations and effects similar to those of the above motor 10 can be obtained. It is necessary to set the shapes of the first recessed portions 16 and the second recessed portion 17 depending on the thickness of the lead 14. However, this configuration simply requires mounting of the different components on the housing 11 and the end bell 12. Therefore, the housing 11 and the end bell 12, which are the main components of the motor 10, can be shared irrespective of the thickness of the lead 14.

Note that either the first recessed portions 16 or the second recessed portion 17 may be provided integrally with the housing, and the other may be provided separately from the end bell. Moreover, either the first recessed portions 16 or the second recessed portion 17 may be provided separately from the housing, and the other may be provided integrally with the end bell.

In the above motor 10, the first recessed portions 16 are provided to the housing 11, and the second recessed portion 17 is provided to the end bell 12, but may be vice versa. For example, even if the first recessed portions 16 are provided integrally with the end bell 12 and the second recessed portion 17 is provided integrally with the housing 11, an effect similar to the above (8) can be obtained. Moreover, in the above motor 10, the second recessed portion 17 is not provided with a projection portion. However, the projection portion 7P, such as illustrated in FIG. 2, may be provided. The entire holding portion structure described using FIGS. 1 and 2 can be applied to a motor.

Note that in the above-mentioned motor 10, the connection target of the lead 14 is the coil 35. However, the connection target is not limited to a coil, and may be, for example, a board. Moreover, the type of motor is not limited to an inner rotor brushless motor, and an application to an outer rotor motor is acceptable, or an application to a brushed motor is acceptable when a lead is used. The application targets of the above-mentioned holding portion structure are not limited to motors, but include electronic devices other than motors.

The invention claimed is:
1. A lead holding portion structure in which a lead is held between a first component and a second component to be assembled to the first component, and the lead is drawn out from inside the first component and the second component, the lead holding portion structure comprising:
two first recessed portions that are arranged side by side, spaced apart from each other along an extension direction of the lead, and each includes a groove extending in the extension direction; and
a second recessed portion that is located between the two first recessed portions in an assembled state of the first component and the second component, and includes a groove that is in opposite orientation to the grooves of the first recessed portions and extends in the extension direction, wherein
either the first recessed portions or the second recessed portion is provided to the first component, and the other is provided to the second component,
in the assembled state, the second component is fixed to the first component,
in the assembled state, the lead placed in the grooves of the first recessed portions and in the groove of the second recessed portion is bent and held by the first recessed portions and the second recessed portion, and
a recessed portion or portions provided to a component where the lead is placed, the component being either the first component or the second component, is or are less in a groove width than a recessed portion or portions provided to a component where the lead is not placed, the component being the other, each of the grooves of the first recessed portions and the groove of the second recessed portion has a shape that joins lower ends of two side surfaces facing each other to a curved bottom surface, at least one of the two first recessed portions and the second recessed portion have a projection portion provided on one or each of the two side surfaces, and the projection portion is not provided on the curved bottom surface.

2. The lead holding portion structure according to claim 1, wherein in the assembled state, the lead is held by one or both of two opposing corner portions of one of the first recessed portions and the second recessed portion and two opposing corner portions of the other first recessed portion and the second recessed portion.

3. A motor to which the lead holding portion structure according to claim 1 is applied, wherein the first component is a housing in which a connection target of the lead is placed, and the second component is an end bell to be assembled to an opening of the housing.

4. The motor according to claim 3, wherein the first recessed portions and/or the second recessed portion is or are provided integrally with the housing and/or the end bell.

5. The motor according to claim 3, wherein the first recessed portions and/or the second recessed portion is or are provided to components different from the housing and the end bell, and the different components are installed on the housing and the end bell, respectively.

6. The lead holding portion structure according to claim 1, wherein the projection portion is not provided on, among the two first recessed portions and the second recessed portion, one closest to a connection target to which an end portion of the lead located at the inside is connected.

7. A lead holding portion structure in which a lead is held between a first component and a second component to be assembled to the first component, and the lead is drawn out from inside the first component and the second component, the lead holding portion structure comprising:

two first recessed portions that are arranged side by side, spaced apart from each other along an extension direction of the lead, and each includes a groove extending in the extension direction; and a second recessed portion that is located between the two first recessed portions in an assembled state of the first component and the second component, and includes a groove that is in opposite orientation to the grooves of the first recessed portions and extends in the extension direction, wherein in the assembled state, the second component is fixed to the first component, in the assembled state, the lead placed in the grooves of the first recessed portions and in the groove of the second recessed portion is bent and held by the first recessed portions and the second recessed portion, at least one of the first recessed portions and the second recessed portion has a projection portion protruding from an inner surface of the groove, the projection portion is provided on one or each of two opposing side surfaces of the inner surface of the groove, and the projection portion is not provided on a curved bottom surface of the groove connecting the two opposing side surfaces.

8. The lead holding portion structure according to claim 7, wherein the projection portion has a shape tapered from a proximal end toward a distal end.

9. The lead holding portion structure according to claim 7, wherein in the assembled state, the lead is held by one or both of two opposing corner portions of one of the first recessed portions and the second recessed portion and two opposing corner portions of the other first recessed portion and the second recessed portion.

\* \* \* \* \*